United States Patent [19]
Ayers et al.

[11] Patent Number: 5,353,216
[45] Date of Patent: Oct. 4, 1994

[54] INVERTER POWER SOURCE RACK

[75] Inventors: James D. Ayers, Bear; Michael J. Ayers, Wilmington, both of Del.

[73] Assignee: Urie & Blanton Company, Inc., Chester, Pa.

[21] Appl. No.: 81,430

[22] Filed: Jun. 22, 1993

Related U.S. Application Data

[63] Continuation-in-part of Ser. No. 855,765, Mar. 23, 1992, abandoned.

[51] Int. Cl.$^5$ ............................................. H02M 1/00
[52] U.S. Cl. .................................... 363/144; 361/732
[58] Field of Search ........................ 363/144; 361/394; 248/639, 672

[56] References Cited

U.S. PATENT DOCUMENTS

| | | | |
|---|---|---|---|
| 681,098 | 8/1901 | Brown | 211/134 |
| 2,602,842 | 7/1952 | Morris et al. | 175/298 |
| 3,717,805 | 2/1973 | Graedinger et al. | 321/8 R |
| 3,721,890 | 3/1973 | Ettinger et al. | 321/8 R |
| 3,858,091 | 12/1974 | Wilkinson | 317/120 |
| 4,034,683 | 7/1977 | DiCenzo | 108/111 |
| 4,652,769 | 3/1987 | Smith et al. | 307/31 |
| 4,729,375 | 3/1988 | Jegers et al. | 128/376 |
| 4,733,025 | 3/1988 | Buerkel | 200/16 B |
| 4,918,565 | 4/1990 | King | 361/119 |
| 4,972,298 | 11/1990 | Casa et al. | 361/429 |

OTHER PUBLICATIONS

Miller Product Information, Feb. 3, 1992 for XMT Rack (2 pages).
Powcon Product Information for Lift Paks and Econo-Paks (1 page).
Equipto Electronics Corp Catalog (1 page).
Allen Bradley Instruction Manual for Bulletin 2100 Centerline Motor Control Centers FIGS. 95 and 96.

Primary Examiner—Steven L. Stephan
Assistant Examiner—Adolf Berhane
Attorney, Agent, or Firm—Elman Wilf & Fried

[57] ABSTRACT

A open-framed and lightweight inverter power source rack made from aluminum that offers the versatility of providing varying amounts of power sources from a single branch circuit external power supply. A first rack can act as a stand-alone power supply for up to four power sources. A second or slave rack detachably connects with the first rack as the need for power sources increases on a job site. The slave rack is fed from the same external power supply as the first rack. As the need for power sources on the job site decreases, the slave rack may be disconnected from the first rack and connected to another rack where additional power sources are required. Moreover, inverter power racks are adapted to be shipped and transported in knock-down, disassembled state for final partial assembly by the user to reduce shipping and manufacturing costs.

25 Claims, 13 Drawing Sheets

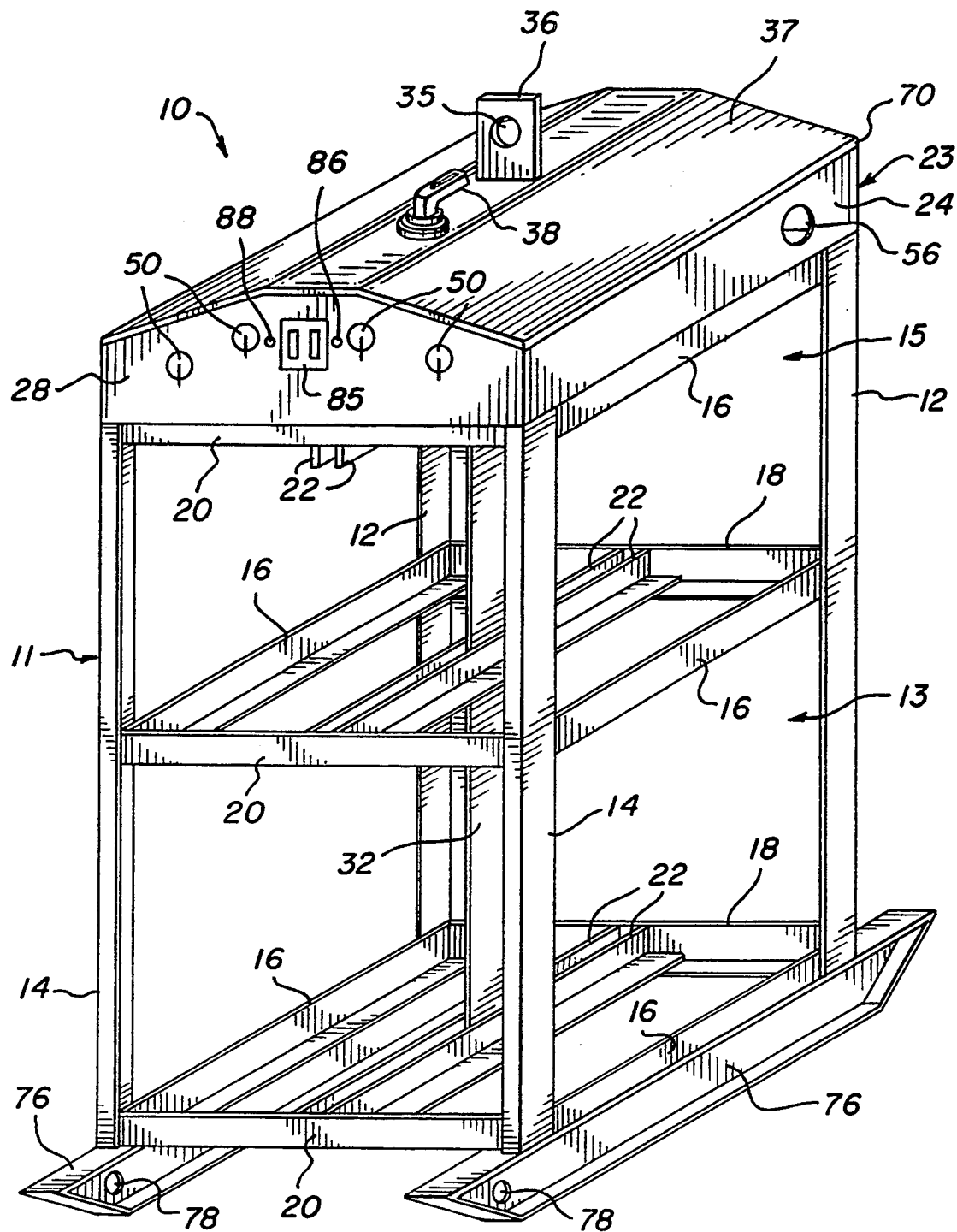

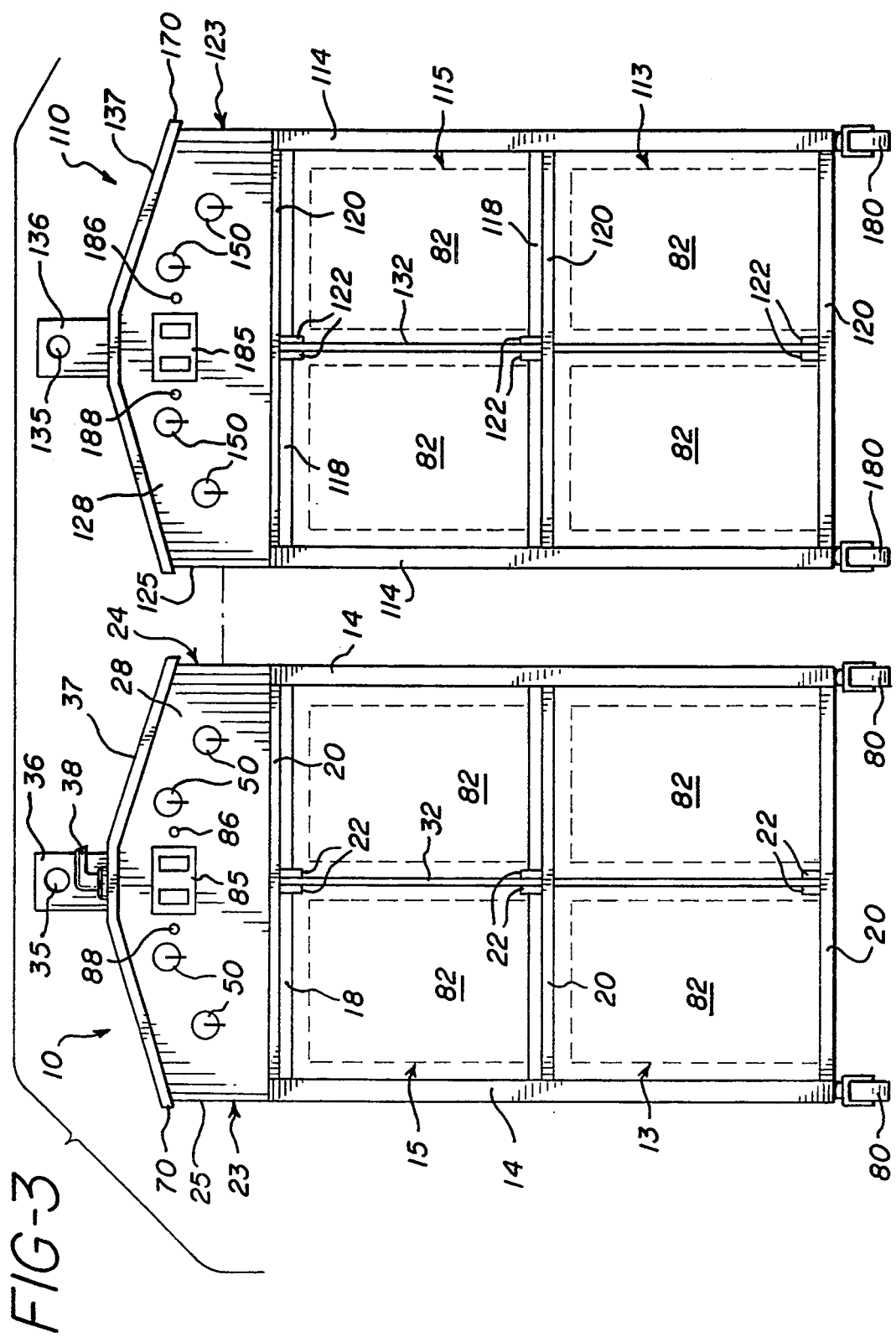

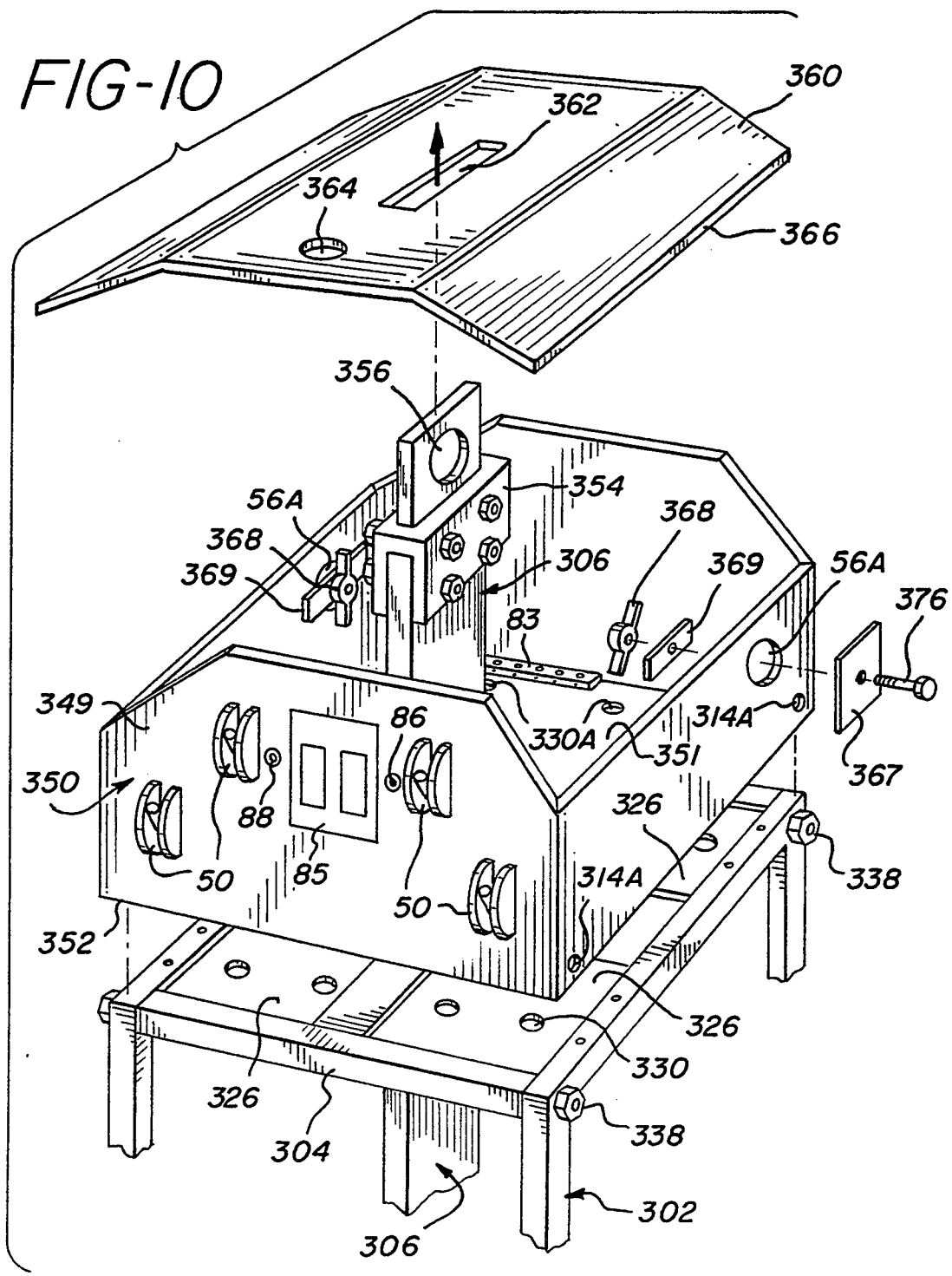

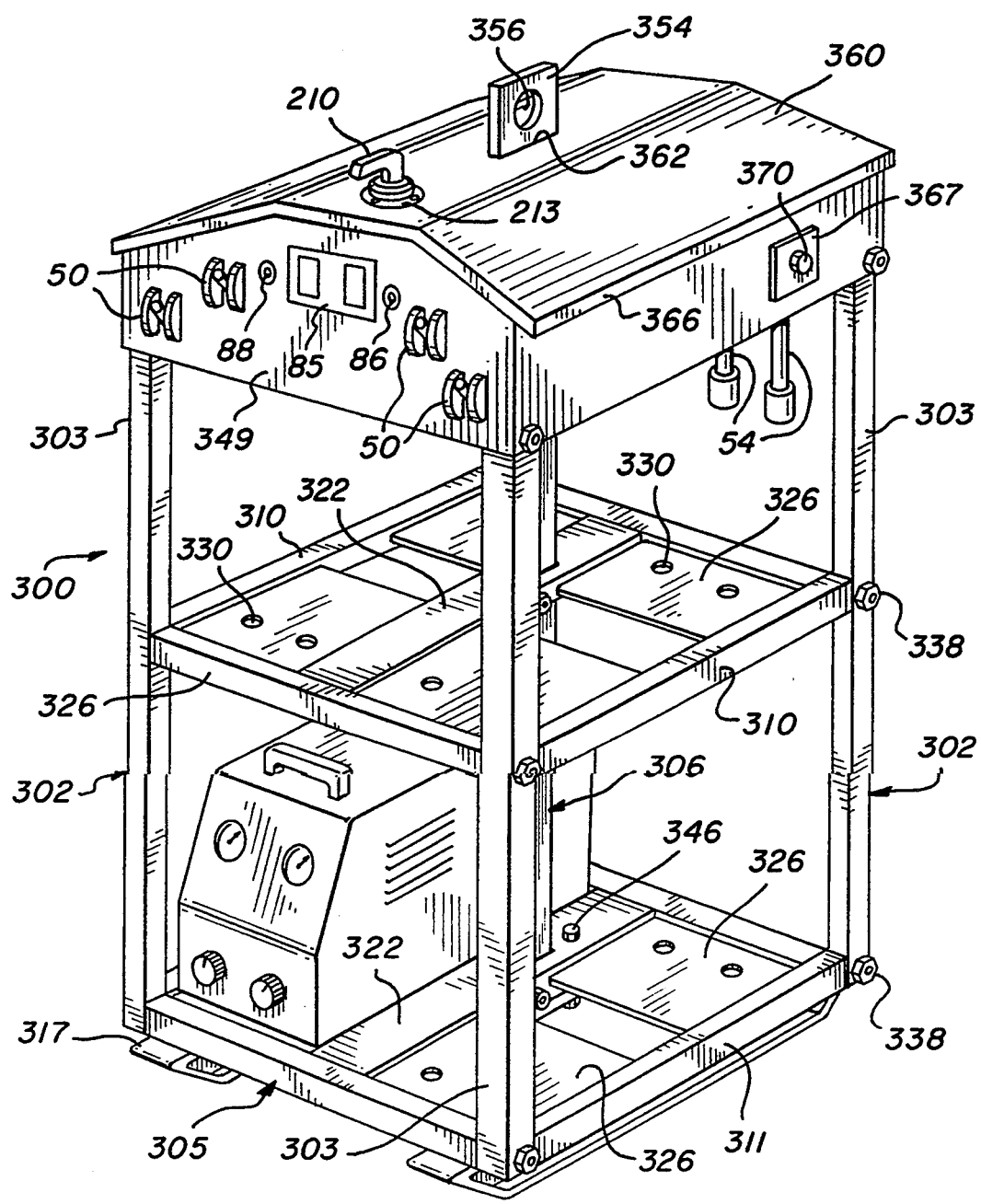

INVERTER POWER SOURCE RACK

CROSS REFERENCE TO RELATED APPLICATION

This application is a continuation-in-part of copending application Ser. No. 07/855,765, titled "Inverter Power Source Rack" filed on Mar. 23, 1992 now abandoned.

FIELD OF THE INVENTION

This invention relates generally to an electrical distribution apparatus, and more specifically to a support rack for welding and plasma arc inverter power sources for use at construction sites and other locations that require the versatility of varying the amount of inverter power sources on site at any one time.

BACKGROUND OF THE INVENTION

Technology advances in the electrical power distribution and electronics field have reduced the size of welding and plasma arc power sources. The large and cumbersome transformer power sources that are wheeled around job sites are being replaced by the more efficient inverter technology. The inverter technology provides a compact and lightweight welding or plasma arc power source ("power source") that provides power for multiple types of welding including, but not limited to, Stick, MIG and TIG and plasma arc cutting respectively. The inverters may be used as a welding or plasma arc power source in any industrial or commercial application.

The compact size and light weight of the power sources allow the power sources to be stacked in racks. The racks provide many advantages including: (1) maneuverability of multiple power sources at one time, (2) a comprehensive power distribution hookup to multiple power sources, and (3) a means to provide multiple power sources on a job site in a neat and safe manner.

Racks for inverter welding power sources are known in the prior art. The XMT TM Rack distributed by Miller Electric Mfg. Co., of Appleton, Wis. provides a rack made from steel that houses eight inverter power sources. The rack weighs about 1,700 pounds fully loaded with eight inverters and must be maneuvered using a fork truck, or a crane or be dragged, skidded are pushed around the job site. The XMT TM Rack provides a common power distribution bus with separate branch circuits protected by circuit breakers that power and isolate the individual inverters.

PewCon Inc., of San Diego, Calif. distributes a variety of modular racks that hold two, four, six or eight inverter power sources. The racks are made from tubular steel, and the larger racks weigh from about 600 to 750 pounds, loaded with power sources. The racks must be maneuvered using a fork truck, or a crane or be dragged, skidded or pushed around the job site. Each six and eight-unit rack provides a common power distribution box that provides power to the individual power sources.

The demand for power sources on a job site varies depending on the stage of construction, demolition or fabrication. Pre-construction or pre-demolition activity may not require a full complement of anticipated power sources. When construction or demolition begins in earnest, the need for power sources increases until the need is maximized during the height of construction or demolition. As the activity decreases, the need for the power sources also decreases. Furthermore, the demand for power sources at any particular location on a construction or demolition site varies as the work is completed in one area and commenced afterwards in another area.

Existing power source racks do not efficiently address the changing power source requirements during the entire schedule of a construction or demolition project. The XMT TM Rack is constructed to support eight power sources. The XMT TM Rack may be efficient during the peak activity of a job when eight power sources are required. But, during the beginning or end of a construction or demolition job, some of the power sources may not be needed (for example, four units may be idle) at the location of the rack or not needed on the job site at all. If four power sources are needed elsewhere, another eight-unit rack would be hooked up to a power supply and the four idle units might be disconnected and removed from the one rack and then mounted and connected to the new rack. Additionally, if the four idle units are not needed on the job site, but are needed at an alternate job site, the power sources would be disconnected, and transported and then connected to another rack elsewhere.

Furthermore, the XMT TM Rack weighs 1,700 pounds fully loaded with eight inverter power sources. The weight is a disadvantage on job sites when the rack must be relocated from one work area to another. Valuable time and resources, such as a crane or fork truck, as well as the required personnel, are wasted when the rack is relocated. If the rack must be relocated from one level to another on a building construction project, and a freight elevator either does not exist or is not rated for the weight of the fully loaded rack plus a fork truck it becomes necessary to use a crane to relocate the rack.

Even though PowCon provides different racks for various numbers of power sources, these racks still do not efficiently meet the changing requirements of power sources on a job site. If four power sources are needed at the beginning of the job, a four-source rack is sufficient. At the peak demand of power sources, an additional four-source rack can be installed, or an eight-source rack can replace the four-source rack. However, the additional four-source rack would require an external power supply hookup that is separate from the one that feeds the existing four-source rack. If the eight-source rack replaces the four-source rack, valuable time is lost transporting two racks, electrically disconnecting the power sources from the four-source rack and connecting those and four more units to the eight-source rack.

SUMMARY OF THE INVENTION

It is accordingly a primary objective of the present invention to provide an inverter power source rack which will overcome the weight disadvantages and the lack of versatility stated above.

The foundation of this invention is a open-frame rack upon which one to four inverter power sources (each a "power source") can be mounted and electrically connected to a common power distribution bus. The rack comprises a frame structure with at least one open level. On top of the frame is an electrical enclosure which contains a main disconnect switch, fuse blocks and fuses and electrical connections. On-Off switches on the front face of the enclosure and separate branch circuit fuses electrically isolate each individual power source.

The invention comprises a first stand-alone rack or alternatively, the first rack mechanically and electrically connected to a second, or slave rack. Each rack is an open-framed structure having at least one open level and an electrical enclosure attached to the frame of each rack. Each rack can provide electrical power to one to four power sources.

The electrical enclosure of the first rack has a main electrical power disconnecting means to electrically isolate the first rack and second rack from an external branch circuit electrical power supply. The main disconnecting means is intended to disconnect the racks from the external power supply only when all power sources are de-energized. The main disconnect feeds three power feed fuses. The power feed fuses are sized to interrupt the external electrical power supply when an electrical fault occurs with the power sources or their associated wiring of either rack. The disconnecting means are also provided with mechanical interlocking means to prevent removal a cover of the electrical enclosure while the disconnecting means are energized by the external branch circuit electrical supply. The electrical enclosure also provides separate on-off switches and branch circuit fuses to electrically isolate each individual power source in the first rack. Each on-off switch is intended to disconnect its corresponding power source from the electrical power supply only when the power source is de-energized. The branch circuit fuses are sized to interrupt the electrical power supply to the corresponding power source when an electrical fault or overload condition occurs with the power source or its associated wiring.

The second rack, or slave rack also contains an electrical enclosure attached to the frame. The slave rack is designed to mechanically attach to the first rack and electrically connect to the main interruptible electrical power supply of the first rack. The electrical enclosure also provides separate on-off switches and branch circuit fuses to electrically isolate each individual power source in the slave rack. Each on-off switch is intended to disconnect its corresponding power source from the electrical power supply only when the power source is de-energized. The branch circuit fuses are sized to interrupt the electrical power supply to the corresponding power source when an electrical fault or overload condition occurs with the power source or its associated wiring.

Each rack is supported by two 4-inch I-beam skids bolted to the frame to enable the racks to be individually dragged or pushed about the job site. Optionally, the skids may be removed, and heavy-duty caster wheels may be bolted to the frame for extra ease of maneuverability, especially around a machine or fabrication shop. The racks can be made from steel, but preferably, the racks are made from aluminum for ease of transportation and maneuverability around the job site. A single rack weighs about 80 pounds unloaded and about 320 pounds when it is supporting four power sources. It can be easily maneuvered around a job site using dollies or hand trucks. The size and weight of the racks enable them to be transported on most freight elevators on a construction site or in a building.

The invention offers the versatility of easily varying the amount of power sources available on a job site. The rack provides means for connecting the rack to a four-unit slave rack that allows eight power sources to be fed from one common external power supply.

During the beginning stages of a construction or demolition job, a single rack supporting four power sources may be sufficient for the work. As the work intensifies, a slave rack can be mechanically and electrically connected to the rack. In contrast with existing racks, the slave rack is lightweight, making it easy to transport to the appropriate site. Additionally, a separate external power source is not required. Therefore, in a relatively short period of time and with minimal expenditure of resources, additional four power sources are readily made available on site. As the work decreases in the particular area, the slave rack can be relocated to connect with another rack elsewhere on site or off site to meet the demands of other jobs for additional power sources.

It is a general object of this invention to provide a power source rack that is so versatile that the rack can be easily expanded or reduced to meet the changing requirements of power sources over the time frame of a construction or demolition job.

It is a further object of the invention to provide a power source rack that is easily maneuverable from one job site to another.

It is a feature of the invention that the rack is made of aluminum, which is lightweight so that it can be easily transported from job site to job site.

It is a further advantage that the invention is modular in construction so that one rack can function as a stand-alone support for four power sources or may connect with another rack to provide a support for eight power sources.

It is a further advantage that when two racks are connected together, the eight power sources are fed from a single branch circuit external power supply.

It is yet another object of the present invention to provide a collapsible inverter power source rack that is supplied in a knocked-down or disassembled state during transportation to the user for reducing transportation costs as well assembly costs.

It is also an object of the present invention to provide a lightweight inverter power source rack having several universal components to reduce manufacturing costs as well as to reduce component complexity of the lightweight inverter power source rack of the present invention.

Other aspects of the invention will be apparent from a description of certain preferred embodiments below and will be more specifically identified in the appended claims.

BRIEF DESCRIPTION OF THE DRAWINGS

FIG. 1 is an isometric view of single rack unit of the invention;

FIG. 3 is an elevation view of two rack units connected together;

FIG. 10 is another exploded partial isometric view of the rack of FIG. 9; and

FIG. 11 is an isometric view of the rack of FIG. 9 having one inverter power source positioned therein.

DETAILED DESCRIPTION

Figure 4A:
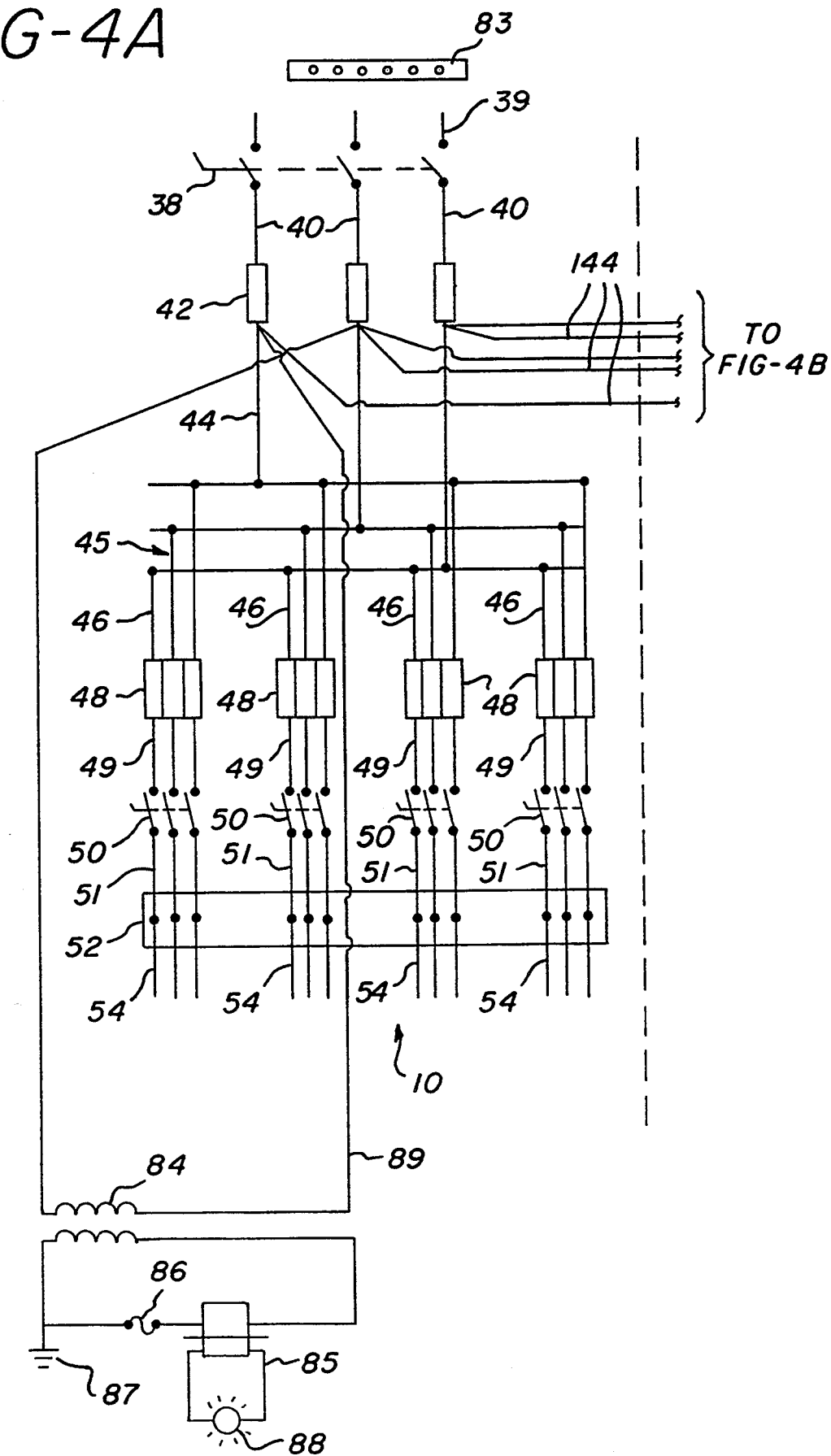
FIGS. 4A–4B is an electrical connection diagram of the embodiment of FIG. 3.

FIG. 1 illustrates the foundation of the rack unit of the invention, a first rack 10 having two open levels 13 and 15 and an electrical enclosure 23 which contains electrical disconnect switches 38 and 50, fuse blocks and fuses 42 and 48, and electrical connection blocks 45 and 52, as shown in FIG. 4A. First rack 10 can be made from any of a variety of materials, preferably metallic, such as steel, so long as the material provides the structural integrity required to safely support four inverter power sources 82, shown in FIG. 3. In a preferred embodiment, first rack 10 is constructed from aluminum alloy to reduce the weight of the structure.

The size of first rack 10 may depend on the particular power source 82 that first rack 10 is designed to support. The dimensions stated below are best suited for an INVERTEC TM V300-PRO inverter welding power supply and PRO-CUT TM 40 inverter plasma arc power supply, both manufactured by Lincoln Electric of Cleveland, Ohio, and are for illustrative purposes only.

In the preferred embodiment, first rack 10 (57 inches tall), comprises an electrical enclosure 23 (11 inches high), a frame 11 (42 inches high) and skid supports 76 (4 inches high). Frame 11 is constructed of aluminum angle, type 6061. Frame 11 comprises two back vertical members 12 and two front vertical members 14. Back vertical members 12 are $2 \times 2 \times \frac{1}{4}$ inch aluminum angle, 42 inches in length. Front vertical members 14 are $1 \times 2 \times \frac{1}{4}$ inch aluminum angle also 42 inches in length. Horizontal side members 16 are $2 \times 2 \times \frac{1}{4}$ inch angle, $22\frac{1}{2}$ inches in length. Six horizontal side members 16 are employed. Horizontal back members 18 are $2 \times 2 \times \frac{1}{4}$ inch angle, 25 inches in length. Three horizontal back members 18 are employed. Horizontal front members 20 are $1 \times 2 \times \frac{1}{4}$ inch angle, 25 inches in length. Three horizontal front members 20 are employed. Center horizontal members 22 are $2 \times 2 \times \frac{1}{4}$ inch angle, $22\frac{1}{2}$ inches in length. Six center horizontal members 22 are employed. Center vertical support member 32 is $3 \times \frac{1}{4}$ inch flat bar, $52\frac{3}{4}$ inches in length. One center vertical support member 32 is employed.

The frame 11 is assembled as shown in FIG. 1. The members of the frame 11 can be bolted together as required or are preferably welded. Center horizontal members 22 are centrally located along the length of horizontal back and front members 18 and 20, and center vertical support member 32 is centrally located within frame 11.

Figure 1A:
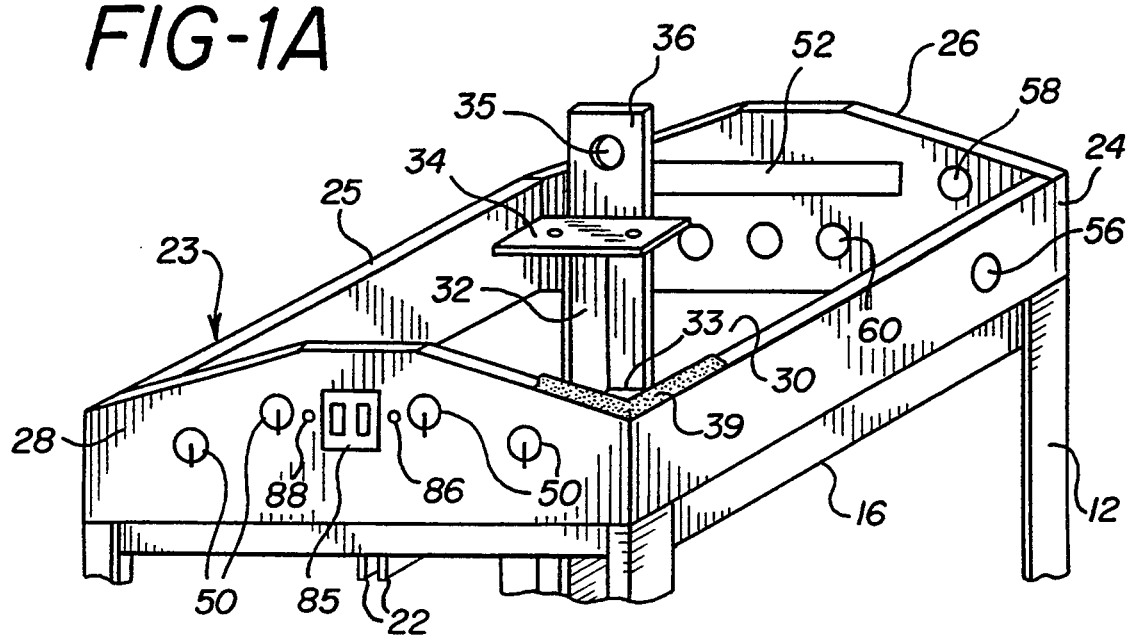
FIG. 1A is an partial isometric view of the embodiment of FIG. 1 with the cover removed.

The electrical enclosure 23, as shown in FIGS. 1 and 1A attaches to the top of the frame 11. Electrical enclosure 23 houses the main electrical disconnect switch 38, power supply fuses 48 and power feed fuses 42, both shown in FIG. 4A, on-off switches 50 and connection blocks 45 and 52, both shown in FIG. 4. The electrical enclosure 23 is preferably constructed of $\frac{1}{8}$ inch aluminum plate, type 3003. Right side panel 24 and left side panel 25, shown in FIG. 1A are 8 inches high by $22\frac{1}{2}$ inches long. Front panel 28 and back panel 26, shown in FIG. 1A are each 25 inches long and are from 8 inches to 11 inches in height, as illustrated in FIG. 1. The electrical enclosure 23 is peaked to allow room for the mechanical operation of the main electrical disconnect switch 38. Side panels 24 and 25 and front and back panels 28 and 26 are preferably welded together. The enclosure bottom 30, shown in FIG. 1A measures $25 \times 22\frac{1}{2}$ inches and is welded at the base of panels 24, 25, 26 and 28. A cutout 33 to allow electrical enclosure 23 to slide over support member 32 and rest on top of frame 11 is centrally located in bottom 30, having dimensions of $3 \times \frac{1}{4}$ inches. Enclosure 23 is preferably welded to frame 11.

After enclosure 23 is positioned on frame 11, a mounting plate 34 ($3 \times 3 \times \frac{1}{4}$ aluminum flat bar) is attached to the end of center support 32 as shown in FIG. 1A. The width of mounting plate 34 adds an additional $\frac{1}{4}$ inch to the height of the center vertical support 32. The total height is now 53 inches so that center vertical support 32 is even in height with enclosure 23. Mounting plate 34 provides a surface on which enclosure cover 37 attaches to enclosure 23. A lifting bar 36, flat bar aluminum, type 6061 and $15 \times 3 \times \frac{1}{2}$ inches in size, attaches to the back edge of center vertical support 32 and to the enclosure bottom 30. A hole 35, about $1\frac{1}{2}$ inches in diameter, is drilled in the top portion of lifting bar 36 to allow a lifting attachment to attach to lifting bar 36. Foam rubber gasket material 39 is positioned, as partially shown in FIG. 1A, along the exposed top edges of enclosure 23 to prevent foreign matter, such as moisture and dust, from entering the enclosure 23 when cover 37 is in place.

Figure 2:
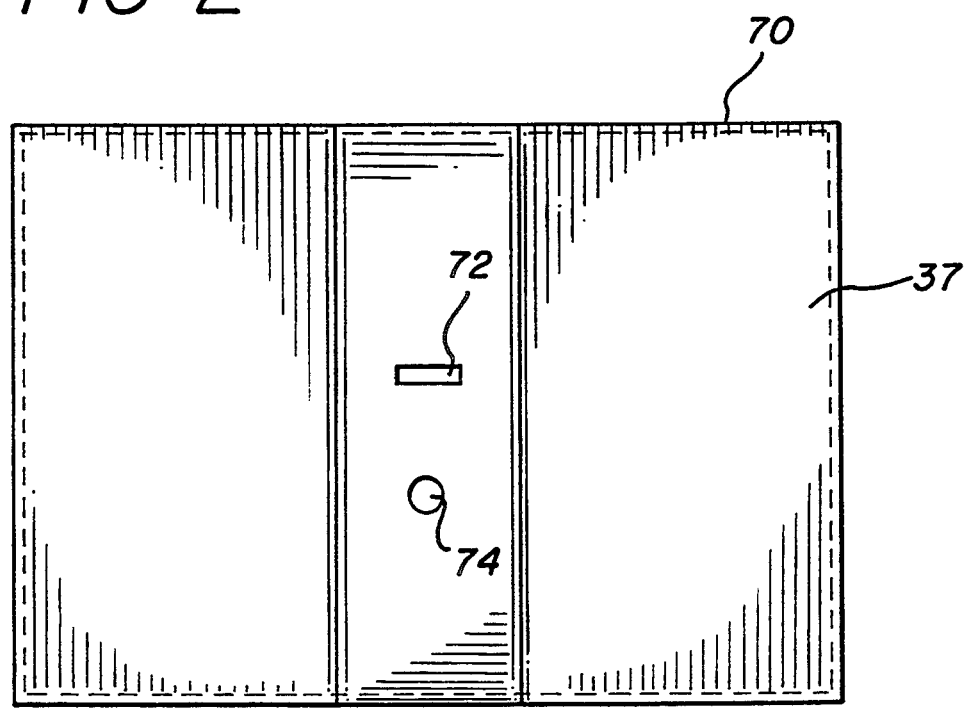
FIG. 2 is a plan view of the cover for the rack unit of the invention.
Figure 2A:
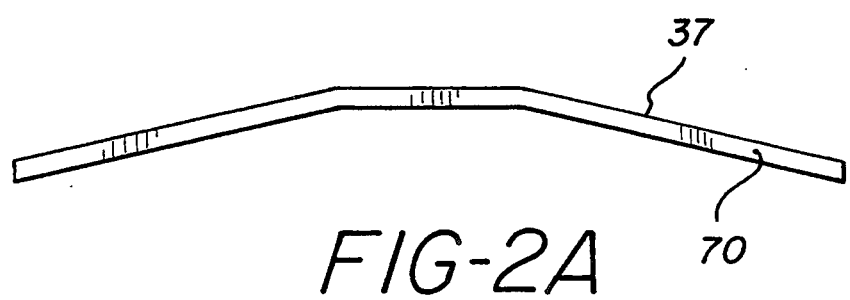
FIG. 2A is an elevation view of the enclosure cover of FIG. 2.

FIGS. 2 and 2A illustrate the cover 37, which is made from $\frac{1}{8}$ inch aluminum plate, type 3003. The cover 37 has a $\frac{1}{2}$ inch lip 70 around its circumference and a slot 72 and a hole 74. The slot 72 is positioned to allow lid 37 to fit around lifting bar 36. Hole 74 is positioned in line with the main disconnect switch 38 allowing the disconnect switch handle to be accessible outside of the enclosure 23. The cover 37 is fabricated to fit over the enclosure 23, and it bolts to mounting bracket 34 and around the circumference of the enclosure 23 as needed.

As shown in FIG. 1 support skids 76 are bolted to the underside of the bottom side horizontal angles 16. Skids 76 provide a longer support base for first rack 10 and a sliding surface to aid in transporting first rack 10. Each skid 76 is made from a 4-inch I-beam and is shaped as a trapezoid with top dimension 36 inches long and the bottom dimension 28 inches long. A plate is welded at either end of each skid 76 to give it a finished look. A hole 78 is cut into each skid 76 as shown in FIG. 1, providing a means to couple a source of traction to pull the rack along the ground. Skids 76 are mounted on horizontal side members 16 to allow two racks to be bolted together at the sides of the racks.

Alternatively, skids 76 may be removed and replaced with heavy-duty caster wheels 80, as shown in FIG. 3. The wheels 80 may be more convenient if first rack 10 is located in a fabrication shop and easy mobility of first rack 10 is required.

The power sources 82, shown in FIG. 3 sit within first rack 10 on the four individual mounting surfaces formed by members 16, 18, 20 and 22 on shown in FIG. 3. When the power sources 82 are in position, the aluminum angles prevent the power sources 82 from accidentally sliding out due to vibration for example. In a preferred embodiment, the power sources 82 are bolted into first rack 10 along common surfaces. Bolting the power sources 82 in place ensures they will stay in place when first rack 10 is being transported using a fork truck or a hand truck for example.

A second rack, also known as slave rack 10A is constructed in the same manner as first rack 10, but with slight differences. Cutout 156, shown in FIG. 1A, is located on left side panel 125 so that when first rack 10 and slave rack 110 are connected together, cutouts 56, shown in FIG. 1A, and 156 are aligned. First rack 10 and slave rack 110 bolt together so that cutouts 56 and 156 on each side panel 24 and 125 respectively are aligned so that an electrical connecting element or chase nipple may be installed through cutouts 56 and 156. Slave rack 110 also does not have a main disconnect switch and power feed fuse blocks and fuses and power feed cutout since slave rack 110 is slaved to the power feed of first rack 10.

Figure 4B:
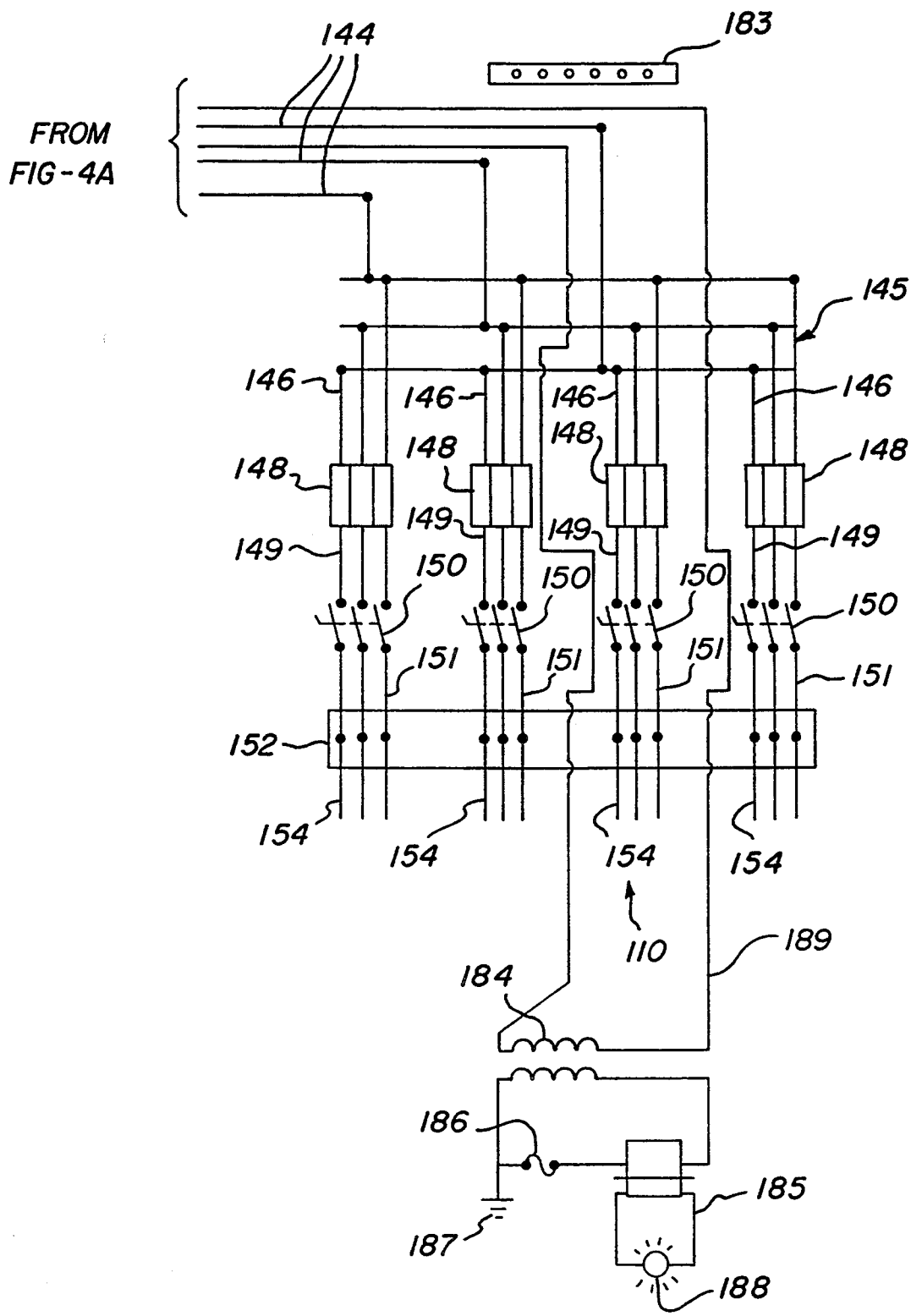

The electrical power distribution of racks 10 and 110 is illustrated in FIG. 4A and 4B. All power distribution elements referred to in this embodiment are rated for 600 V. All fuse sizes and electrical cable sizes should be rated for 600 V and sized in accordance with the latest edition of the National Electric Code and the power requirements of the specific inverter power sources 82. Fuse and cable sizing are known to those skilled in the art of electrical power distribution.

An external branch circuit power supply 39 feeds main disconnect switch 38 located on first rack 10 via power feed cutout 60, shown in FIG. 1A, located on enclosure back panel 26. Power supply 39 can be either single-phase, 230 V or 460 V or three-phase, 230 V or 460 V depending upon the specific electrical requirements of the inverter power source 82. For simplicity of description, reference will be made to a three-phase power input. Switch 38 is a rotary-type disconnect switch, such as one manufactured by Cutler-Hammer of the Eaton Corp., Milwaukee, Wis.

As shown in FIGS. 5–8 a switch handle 208 of disconnect switch 38 extends through cover 37 to enable an individual to energize or de-energize the power circuit with cover 37 attached to enclosure 23. Disconnect switch 38 is supplied with a mechanical interlocking means to prevent disconnect switch 38 from energizing the power circuit with cover 37 removed from enclosure 23. This mechanical interlock, as described below, and known to those skilled in the art of electrical power distribution, is shown in FIGS. 5 through 8. One such exemplary switch is manufactured by Cutler-Hammer of Eaton Corp., Milwaukee, Wis., shown in their product Catalog No. D-0100, dated Jul. 1, 1990.

As shown in FIG. 5 through 8, shaft (Cutler-Hammer catalog number C362S22, preferably having 5½ inches length) 200, which is preferably square shaped in cross section, is secured at one end to a boss 204 of switch portion, shown partially, of disconnect switch (Cutler-Hammer catalog number C362N200) 38 by means of screw 202 positioned on boss 204. The other end of shaft 200 is provided with a cylindrical pin 214 secured at a right angle to shaft 200 to form a "T" shaped end. Switch handle (Cutler-Hammer catalog number C362H25) 208 is preferably injection molded from polymer material, such polyester, and is provided a lever 210 having a centrally disposed slot 248 therethrough. Switch handle 208 further comprises an integral sleeve 207, which enters hole 74 on cover 37. Integral sleeve 207 is provided with a square shaped recess 216 and a slotted recess 218. Size of square shaped recess 216 is sufficiently larger than square shaft 200 and size of slotted recess 218 is sufficiently larger than the external dimensions of pin 214 at the "T" shaped end of shaft 200. As a result, square shaft 200 and size of slotted recess 218 readily allow free slidable movement of shaft 200 therein. An injection molded selector ring 211 is mounted on integral sleeve 207 of switch handle 208 and it is retained and locked by positioning a metal ring 213 into slotted portions on sleeve 207. Switch handle 208 is secured to cover 37 by at least two self tapping screws 212 screwed into screw mounting bosses of selector ring 211.

A spring loaded "T" shaped metal plate 220 is positioned in square recess 216 and slotted recess 218 and is further provided with a compression spring 222, to force metal plate 220 towards shaft 200. Metal plate 220 is retained within square recess 216 and slotted recess 218 by means of a metal ball 224 and a metal ball 238 positioned in recesses provided on sleeve 207. Metal balls 224 and 238 are free to move in their respective recesses. However, metal ball 224 at one end of its recess is prevented from falling out by a spring loaded locking cam 228, which slides up and down (as shown by arrows in FIG. 5) in a cylindrical recess 232 located in switch handle 208. The shape and size of slotted recess 218 is such that it prevents ball 224 at the other end of its recess from falling into slotted recess 232 and square recess 216. Locking cam 228 is provided with a conical shape which rides against metal ball 224.

Similarly, metal ball 238 is prevented at one end of its recess from falling out by an inclined ledge shape of a locking arm 240, which rides against metal ball 238. The shape and size of slotted recess 218 is such that it prevents ball 238 at the other end of its recess from falling into slotted recess 232 and square recess 216. Locking arm 240 slides up and down (as shown by arrows in FIG. 5) in a locking arm recess 243 located in switch handle 208. Locking arm 240 can be moved up or down by manually moving, as shown by arrows in FIG. 6, a pad lock arm 244, which engages a shaft 242 on locking arm 240 to provide the aforestated up and down motion.

Figure 5:
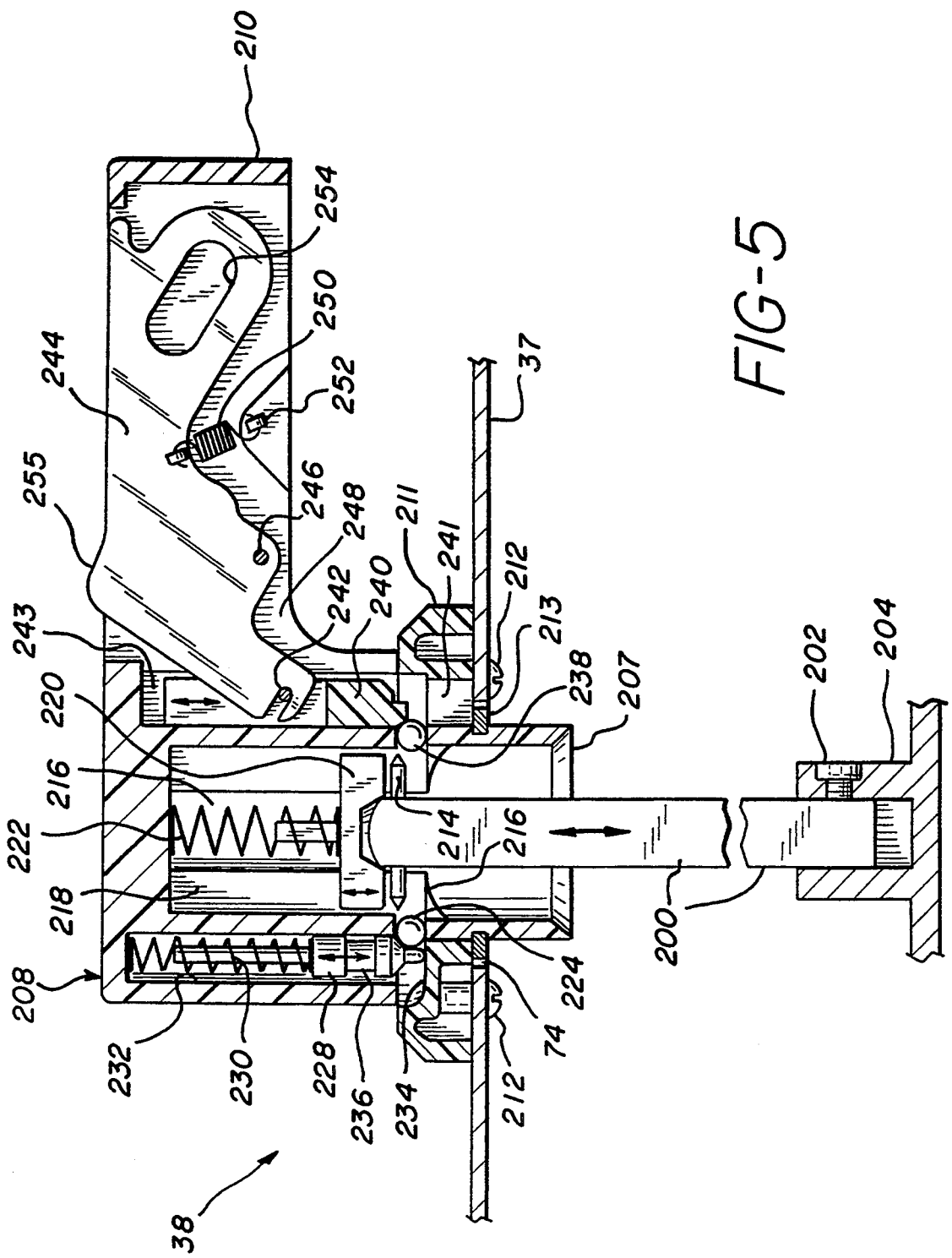
FIG. 5 is a partial cross sectional view of an exemplar of main disconnect switch suitable for the present invention.

Pad lock arm 244 is preferably made from flat steel plate and it is adopted to pivot on a pivot pin 246 located in pad lock arm slot 248 of lever 210. One end of a pad lock arm tension spring 250 is hooked to pad lock arm 244 and the other end is secured to a prong 252 located in pad lock arm slot 248 of lever 210. FIG. 5 shows pad lock arm 244 held in a repose position by the tension force of pad lock arm tension spring 250. Substantially all of pad lock arm 244 is positioned inside pad lock arm slot 248, except a raised portion 255. Pad lock arm 244 is further provided with a pad lock slot 254.

In operation, FIG. 5 shows switch handle 208 in "OFF" position where square shaft 200, as stated earlier, can readily slide up or down into square recess 216 and slotted recess 218 without any engagement since metal balls 224 and 238 are free to move about in their respective recesses. As a result, cover 37, having switch handle 208 attached thereto, can be readily removed while switch 38 is in a de-energized state.

Figure 6:
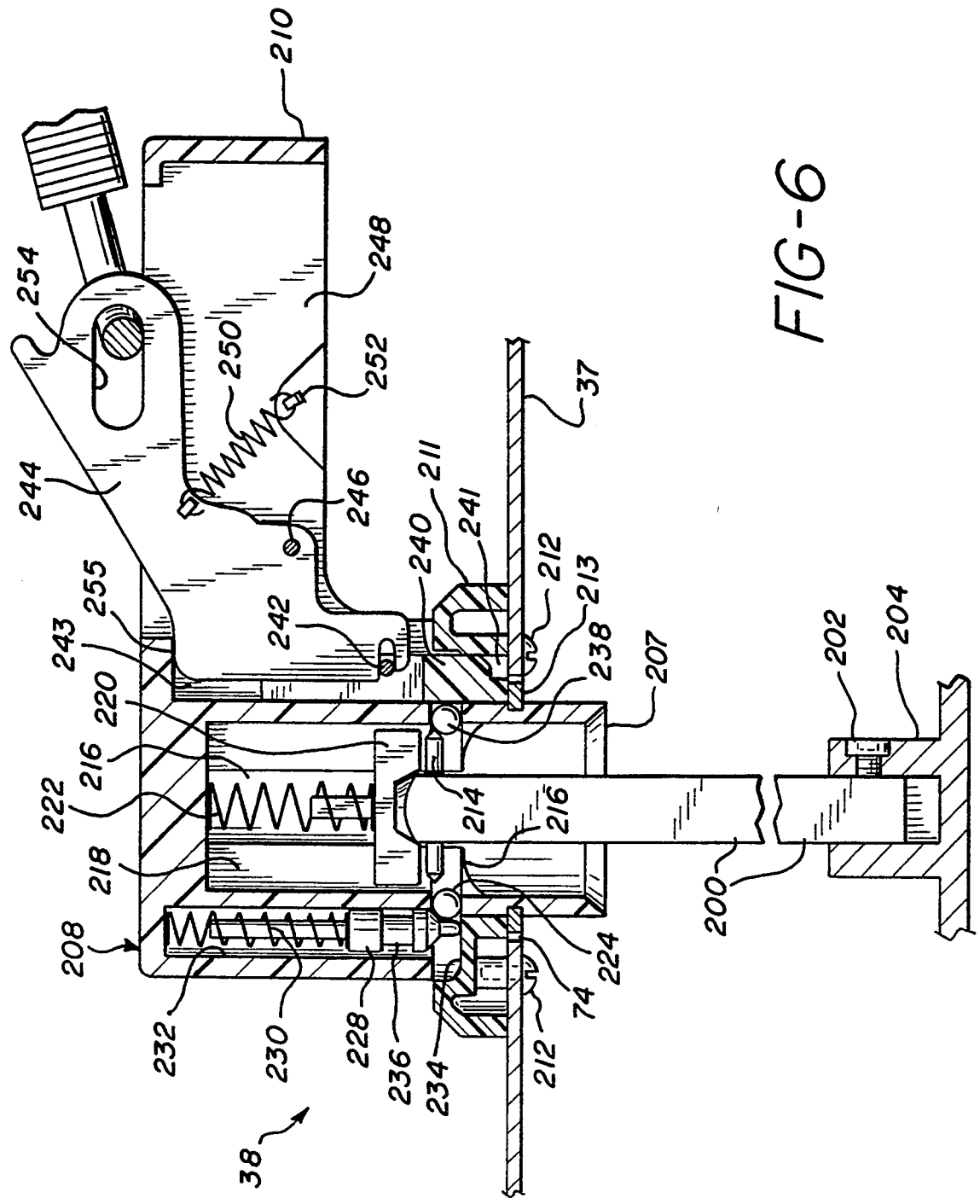
FIG. 6 is a partial cross sectional view of the main disconnect switch of FIG. 5 in a manually locked, switch "OFF" position.

FIG. 6 shows a passive locking arrangement of switch 38, wherein switch handle 208 and thereby cover 37 attached thereto is effectively locked in "OFF" position by manually pressing raised portion 255 to lift pad lock arm 244 out of pad lock arm slot 248 and then installing a conventional pad lock 257 through pad lock slot 254. When pad lock arm 244 is raised, it pushes locking arm 240 down into a locking arm slot 241 provided in selector ring 211, which prevents rotation of switch handle 208 from "OFF" position to "ON" position. Furthermore metal ball 238 is prevented from free movement by locking arm 240. As a result, cylindrical pin 214 of shaft 200 cannot ride over metal ball 238 to disengage switch handle 208 from shaft 200, thereby preventing removal of cover 37. The aforestated passive locking arrangement prevents unauthorized use of or tampering with electrical hardware located inside electrical enclosure 23.

Figure 7:
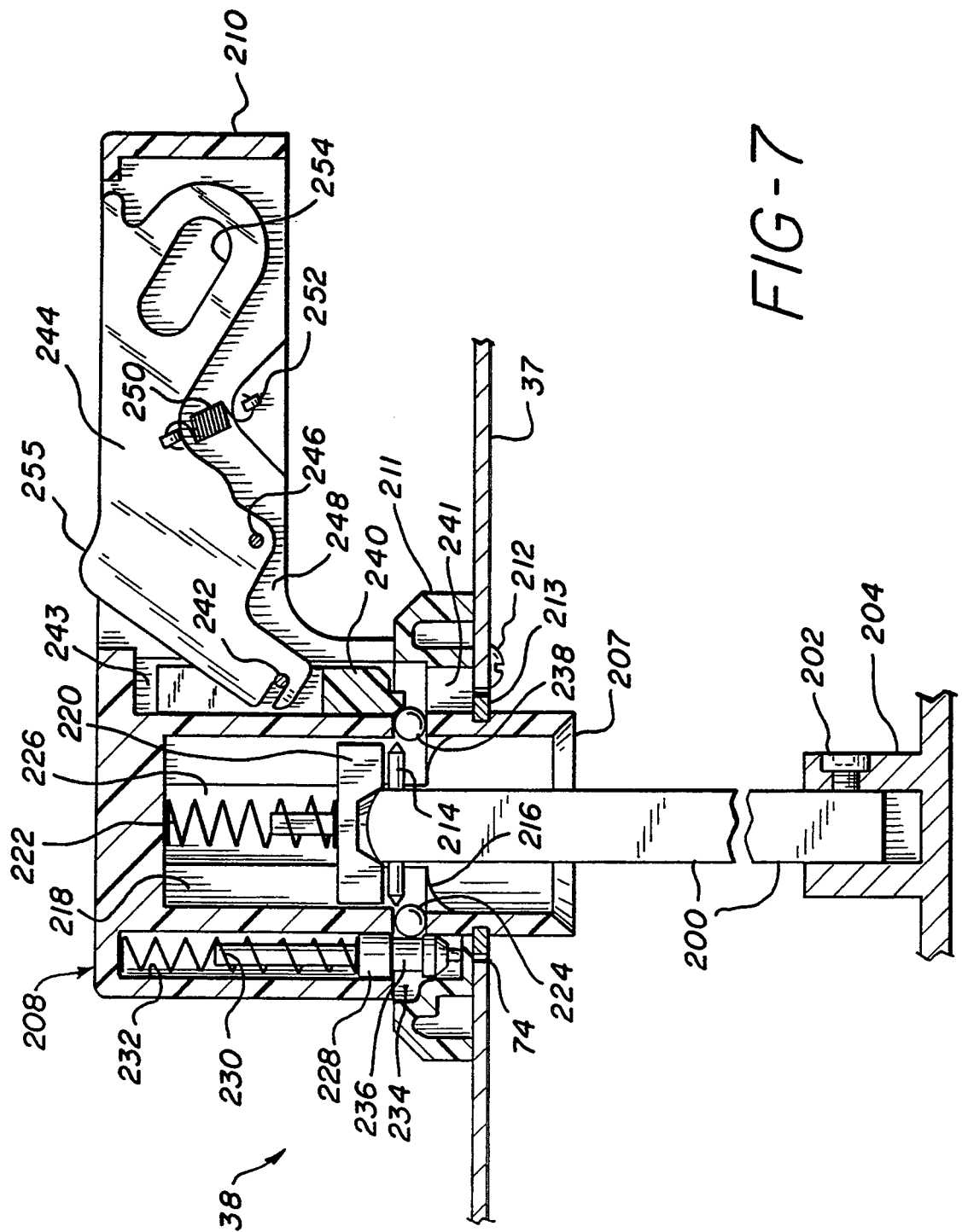
FIG. 7 is a partial cross sectional view of the main disconnect switch of FIG. 5 in an automatically locked, switch "ON" position.
Figure 8:
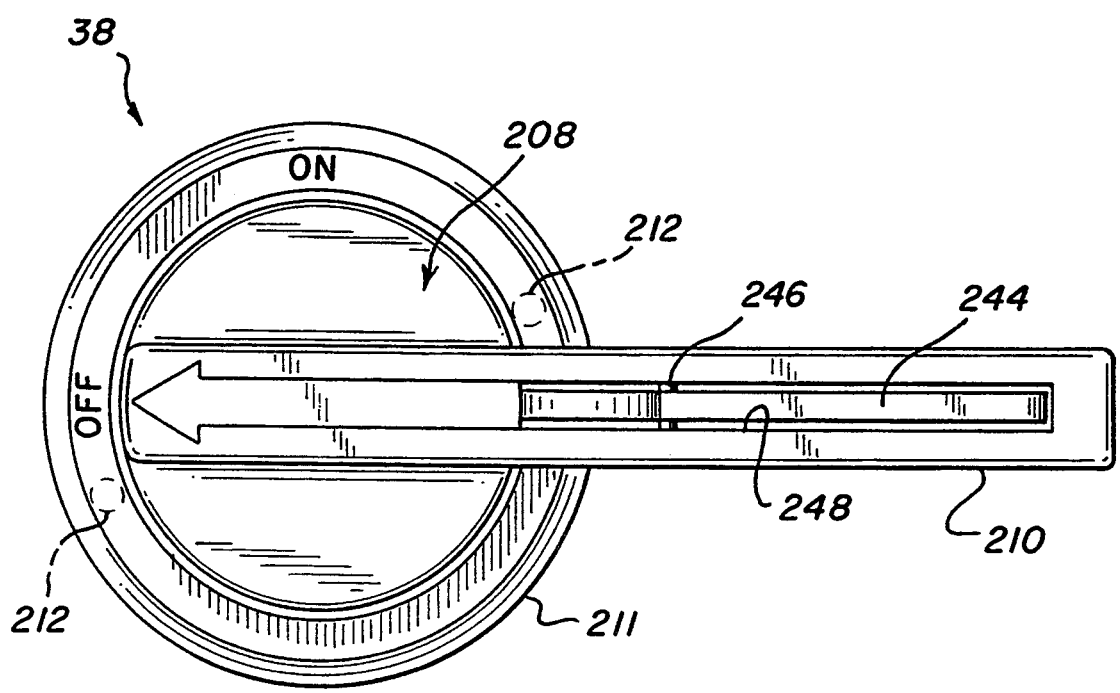
FIG. 8 is a partial plan view of the main disconnect switch of FIG. 5.

FIG. 7 shows the arrangement of switch 38 when it is energized by turning switch handle 208, as shown in FIG. 8, from "OFF" position to "ON" position. As the switch handle 208 is turned, a bullet end provided on locking arm 228, pressed down by a locking arm spring 230, rides against a locking cam surface 234 located in selector ring 211, which remains stationary since it is secured to cover 37 by screws 212. As seen in FIGS. 5 and 7, locking cam surface 234 in "OFF" position, as shown in FIG. 5, is at a higher elevation than one in an "ON" position, shown in FIG. 7. As result, locking arm 228 is pushed down to wedge metal ball 224 between a locking arm slot portion 236 and the recess of ball 224 in sleeve 207. As a consequence thereof, cylindrical pin 214 of shaft 200 cannot ride over metal ball 224 to disengage switch handle 208 from shaft 200 and pin 214 remains in an engaged position, and since switch handle 208 is bolted to cover 37, handle 208 cannot be separated from electrical enclosure 23. The aforestated locking arrangement thereby prevents accidental exposure of the user to electrical shocks resulting from the energized electrical power.

Referring now to FIGS. 4A and 4B, cables 40 connect the load side of disconnect switch 38 to three power feed fuse blocks and fuses 42, sized as required. Power feed fuse blocks and fuses may be substituted by conventional resettable circuit breakers. Cables 44 connect the load side of each power feed fuse block and fuses 42 to a common connection block or terminal block 45 in enclosure 23. Cables 144 connect the load side of power feed fuse blocks and fuses 42 to terminal block 145 in enclosure 123 by way of holes 56 and 156.

Branch circuits for individual power sources 82 feed from terminal blocks 45 and 145 via cables 46 and 146 to branch circuit fuse blocks and fuses 48 and 148. Branch circuit fuse blocks and fuses may be substituted by conventional resettable circuit breakers. Fuses 48 and 148 are sized to protect the individual power sources 82. Cables 49 and 149 connect to on-off selector switches 50 and 150. Switches 50 and 150 are cam operated selector switches, such as catalog no. A3203/PL75, manufactured by Advance Controls, Inc., of Wood Dale, Ill. Switches 50 and 150 are mounted on enclosure 23 and 123 front panel 28 and 128 respectively. Switches 50 and 150 enable individual power sources 82 to be safely turned on and off without affecting the operation of other power sources 82 within racks 10 and 110.

Cables 51 and 151 connect the load side of switches 50 and 150 to a terminal block 52 and 152, respectively. Cables 54 and 154 connect the individual power sources 82 to the respective locations on terminal blocks 52 and 152. Cables 54 and 154 enter enclosures 23 and 123 via four cutouts 60 and 160, not shown, located on enclosure back panel 26 and 126 respectively. Alternatively, quick-disconnect couplings could replace terminal blocks 52 and 152. One connection of the couplings could be mounted in the face of enclosure back panel 26 and 126. The other half of the coupling attaches to a cord electrically attached to the power source 82. In this manner, individual power sources 82 could be connected and disconnected without the need to remove lid 37 and 137 to access terminal blocks 52 and 152.

As shown in FIGS. 4A-4B, electrical enclosure 23 of first rack 10 and electrical enclosure 123 of slave rack 110 are further provided with ground bars 83 and 183, respectively for proper grounding of inverters and the power supply. Ground bars 83 and 183 are conventional, and a series of holes with securing bolts are provided to connect grounding wires from inverters and power supply to ground bars 83 and 183. Aluminum ground bars are preferred.

First rack 10 and slave rack 110 are further provided with means for supplying a 115-volt power output to which the user can connect conventional power tools, such as electrical drills. As shown in FIGS. 4A-4B, cables 89 and 189 of first rack 10 and slave rack 110, respectively, are connected to a single phase on the load side of the power feed fuse blocks for supplying a single phase primary voltage from external branch power supply 39 to a step down electrical transformer 84 and 184 mounted in enclosures 23 and 123 of first rack 10 and slave rack 110, respectively. Single phase transformers most suitable for use in the present invention are rated at about 1.0 KVA, wired on the primary side for 208/230/460/575 volts @50/60 Hertz and on the secondary side for 110/115 volts having Class 180 insulation. Primary input voltage of 575 volts and secondary output voltage of 115 volts is preferably utilized. Such a transformer is supplied by GS Hevi-Duty Electric, a unit of General Signal, Goldsboro, N.C. In order to prevent electrical shock hazards, as shown in FIG. 1-4, 10 and 11, the circuits on the secondary sides of transformers 84 and 184 include conventional out-door type ground fault interrupter receptacles (preferably rated at 15 Amperes @120 Volts, NEMA Configuration 5-15R) 85 and 185, supplied by Pass & Seymour (catalog number 1591-S), each receptacle being capable of connecting two loads, such as an electric drill, a light source and the like. Pilot lights 88 and 188 on the load side of the secondary circuits of first rack 10 and slave rack 110, respectively, are provided to indicate the presence of ground fault, i.e., for example moisture. Pilot light 88 or 188 would not be lit if ground fault is present.

Figure 9:
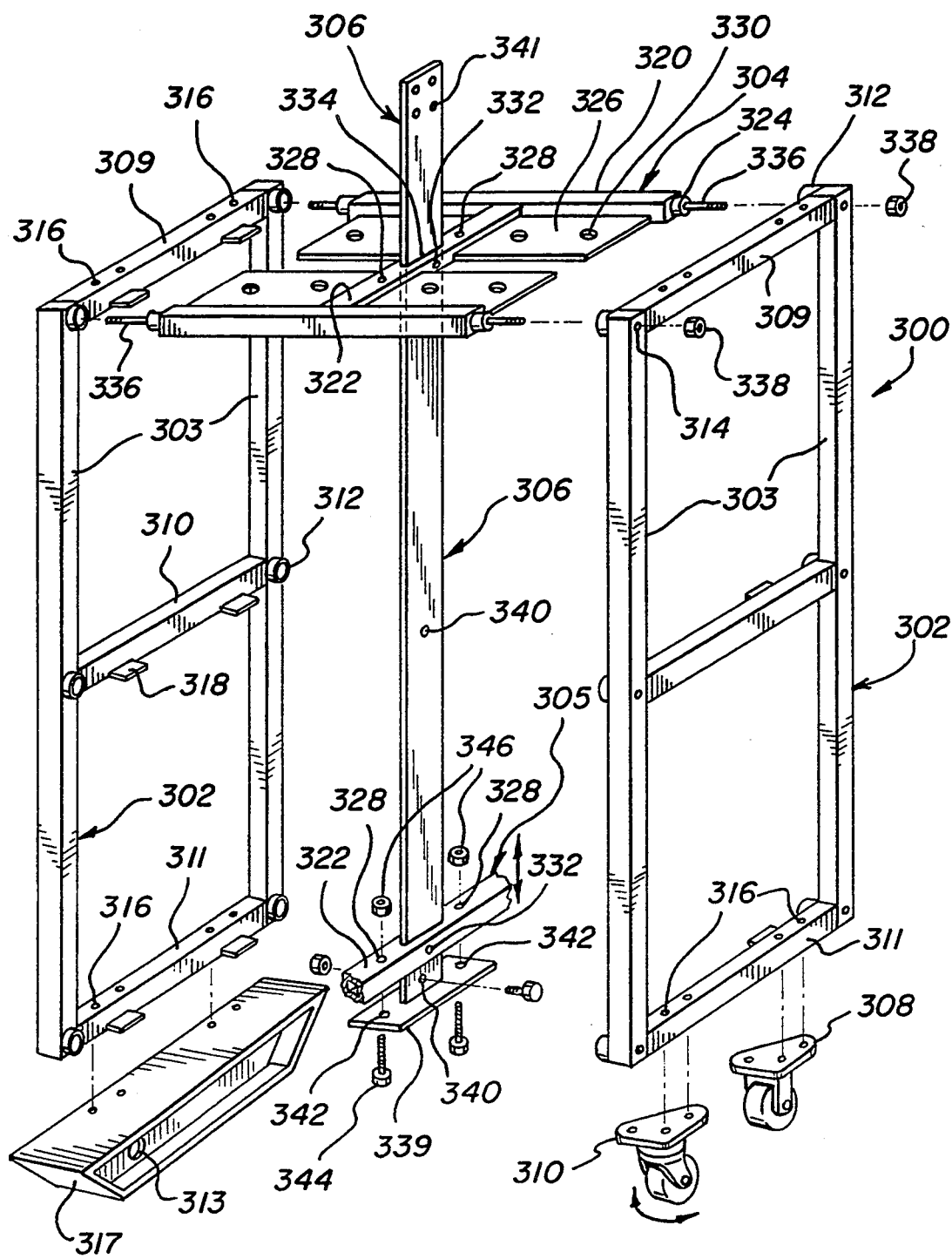
FIG. 9 is an exploded partial isometric view of another embodiment of a single rack of the present invention.

In another embodiment of the present invention, there is shown in FIGS. 9 through 11 a light weight collapsible inverter power source rack 300, which can be readily transported and/or erected on-site by the user. Furthermore, many components of inverter power source rack 300 are provided with commonality of structure and function. As a result, these components can be readily mass produced, and their manufacturing costs can be drastically reduced.

FIG. 9 shows a partial isometric view of collapsible inverter power source rack 300, which is made from square or cylindrical tubular members of rust protected mild steel or aluminum. A 1½ inch square tubular member of aluminum having ⅛ inch wall thickness is preferred.

Power source rack 300, shown in FIGS. 9–11, is provided with two side flames 302, which are identical in shape and structure. Each side frame 302 is provided with at least an upper rung 309 and a lower rung 311, preferably with a mid-level rung 310, all joined to vertical members 303 to form frame 302. Side frame 302 further comprises a plurality of female connecting sleeves 312 affixed to all four corners as well as to "T" junctions formed by mid-level rung 310 with vertical members 303. Female connecting: sleeves 3 12 are preferably made of 1½ inch diameter aluminum tube of 1½ inches height. At the center of female connecting sleeves 312, a plurality of side frame holes 314 are drilled in side frame 302. Upper rung 309, mid-level rung 310 and lower rung 311 are preferably provided with a plurality of support ledges 318.

FIG. 9 shows power source rack 300 further comprising an upper universal inverter support frame 304 and a lower universal inverter support frame 305, shown partially. Upper universal inverter support frame 304 and lower universal inverter support frame 305 are identical in shape, structure and function and each of which comprises an "H" shaped structure formed by horizontal members 320 connected to a central member 322, which is provided with a centrally disposed spar slot 334 and two equidistantly positioned holes 328 on either side of spar slot 334. Each end of horizontal members 320 is provided with a male connecting sleeve 324, adapted to mate with female connecting sleeve 312 on said frame 302, Male connecting sleeves 324 are preferably made of 1¼ inch diameter aluminum tube of 1¼ inch height. Power source rack 300 is preferably provided with a mid-level universal inverter support frame, not shown in FIG. 9 for the sake of convenience, that is identical to upper universal inverter support frame 304 or lower universal inverter support frame 305. Upper universal inverter support frame 304 and lower universal inverter support frame 305, each of which is further provided with four inverter support plates 326 joined to either side of central member 322 and horizontal members 320. Inverter support plates 326 are provided with a plurality of mounting holes 330.

Power source rack 300 is erected by detachably connecting upper universal inverter support frame 304 to upper rungs 309 of side frames 302, detachably connecting lower universal inverter support frame 305 to lower rungs 311 of side frames 302 and preferably detachably connecting mid-level universal inverter support frame, not shown in FIG. 9, to mid-level rungs 310 of side frames 302. Preferably, all of the aforementioned universal inverter support frames rest on support ledges 318 of side frames 302. The aforementioned detachable connection is achieved by first engaging male connecting sleeves 324 with female connecting sleeves 312 and then passing a plurality of long threaded rods 336 through holes 314 of side frame 302, through horizontal members 320 and then through holes 314 of the other side frame 302. Threaded rods 336 made from rust protected ⅜ inch diameter steel bar stock are preferred. Threaded rods 336 are provided with sufficient length to expose threaded portions at other ends. Suitable nuts 338 are threaded on threaded rods 336 to secure side frames 302, upper universal inverter support frame 304, mid-level universal inverter support frame, if present, and lower universal inverter support frame 305 of power source rack 300. If required, locking washers, not shown, may also be provided between nuts 338 and side frames 302. Structural integrity of power source rack 300 may be further improved by a centrally located spar 306, preferably made from a flat aluminum plate stock of 3×¼ inch thickness. Spar 306 is provided with a flat plate 339, joined at right angle to it. Flat plate is provided with at least two plate holes 342. Spar 306 is sequentially slid through spar slots 334 on lower universal inverter support frame 305, the mid-level universal inverter support frame, if present, and then through spar slot 334 on upper universal inverter support frame 304. Connecting means, such as bolts 344, are conveyed through holes 328 located on central member 322 of lower universal inverter support frame 305 and threaded to matching nuts 346. Spar 306 is further secured to central member 322 of lower universal inverter support frame 305, the mid-level universal inverter support frame, if present, and upper universal inverter support frame 304, by slipping a bolt, preferably same as bolt 344, through each side hole 332 on central member 322 and each spar hole 340 on spar 306 and then securing the bolt with a nut, preferably same as 346.

Once power source rack 300 is erected, an electrical enclosure 350, which is similar in material and structure to electrical enclosure 23 shown in FIG. 1, can be connected to upper universal inverter support frame 304. FIG. 10 also shows a front face 349 of electrical enclosure 350 on which on-off switches 50 (also shown in FIG. 3) are mounted. As shown in FIG. 10, a skirt 352 surrounds the bottom edge of enclosure 350. Skin 352 of enclosure 350 slips over upper universal inverter support frame 304 having side frames 302 mounted on either of its sides, such that a floor 351 of enclosure 350 rests on top of upper universal inverter support frame 304 and side frames 302. Threaded rods 336 connecting upper universal inverter support frame 304 to side frames 302 are removed prior to or positioned after installation of enclosure 350. Threaded rods 336 are then slipped through holes 314A on side walls of enclosure 350 to secure it to upper universal inverter support frame 304 having side frames 302 mounted on either of its sides. Holes 330A in floor 351 and holes 330 on inverter support plates 326 of upper universal inverter support frame 304 are used to additionally connect enclosure 350 by means of conventional nuts and bolts (not shown) to upper universal inverter support frame 304. Spar 306 passes through a corresponding slot (not shown) in floor 351 and an inverter rack lifting bracket 354 made of aluminum or rust protected steel and having a lifting hole 356 disposed thereon, is connected by conventional connecting means, such as nuts and bolts mounted through a plurality of holes 341 on spar 306 (shown in FIG. 9) and matched holes 340A on inverter rack lifting bracket 354.

An electrical enclosure cover 360 is then placed on top of enclosure 350. Preferably, a foam rubber gasket, not shown but similar to foam rubber gasket 39 (partially shown in FIG. 1A), is positioned along the exposed top edges of enclosure 350 to prevent foreign matter, such as moisture and dust, from entering the enclosure 350 when cover 360 is in place. When enclosure cover 360 is used for a first rack 10, shown in FIG. 3, it is provided with a hole 364 to mount electrical switch handle 208 and selector ring 211 (shown in FIGS. 5–8) and when enclosure cover 360 is used for a second rack (not shown, but analogous to rack 110, shown in FIG. 3) hole 364 is either eliminated or it is plugged with a suitable, preferably electrically nonconductive, cap (not shown) to prevent the user's accidental exposure to electrical shocks as well as to prevent entry of rain water inside enclosure 350. Enclosure cover 360 is further provided with an inverter rack lifting bracket slot 362 through which a portion of inverter rack lifting bracket 354 having lifting hole 356 thereon projects out as well as a ½ inch lip 366 all around the edge of cover 360 to prevent rain water from entering inside enclosure 350. The side walls of electrical enclosure 350 are provided with holes 56A, such that enclosure 350 can be used for either first rack 10 or second rack 110, shown in FIG. 3. Each hole 56A is plugged by means of a metal or plastic plate 367 anchored by a retainer strip 369, wing nut 368 and a suitable bolt 376, which passes though corresponding holes in plate 367 and retainer strip 369. The user removes the desired plate 367 to expose desired hole 56A when used as first rack 300 or second rack.

Finally, as shown in FIG. 9, lower universal inverter support frame 305 is provided with either a set of conventional caster wheels or a pair of support skids 317 (similar in function and structure to support skids 76 of FIG. 1) each having a hole 313 for pulling rack 300 by means of chains or rope. Preferably a pair of pivotable caster wheels 310 are installed on the side of lower universal inverter support frame 305 facing front face 349 of electrical enclosure 350, shown in FIG. 10 and a pair of fixed caster wheels 308 are provided on the side of lower universal inverter support frame 305 away from front face 349 of electrical enclosure 350.

FIG. 11 shows a fully assembled rack 300 with one inverter power source mounted on the lower left hand side.

Modifications and changes from the specific form of the invention herein shown and described as a preferred embodiment will occur to those skilled in the art. All such modifications and changes not departing from the spirit of the invention are intended to be embraced within the scope of the appended claims.

What is claimed is:

1. An inverter power source rack comprising:
   (a) a light weight moveable first rack consisting of an open frame having a centrally positioned spar therewithin, said open frame having at least one open level shaped to support at least one welding or plasma arc inverter power source, comprising:
      (i) an electrical enclosure positioned on top of said open frame of said first rack, said enclosure having a detachable cover positioned thereon;
      (ii) disconnecting means for receiving an external branch circuit electrical power supply,
      (iii) means for providing a main interruptible electrical power from the disconnecting means to a first common connection bus,
      (iv) means for providing at least one isolated and interruptible electrical power supply from the first common connection bus to at least one means for selectively providing electrical power to at least one said inverter power source; and
      (v) mechanical interlocking means to prevent removal of said cover while said disconnecting means are energized by said external branch circuit electrical power supply, said mechanical interlocking means comprising handle means positioned on said cover and detachably engaged with said disconnecting means,
   (b) a light weight moveable second rack consisting of an open frame having a centrally positioned spar therewithin, said open frame having at least one open level shaped to support at least one said welding or plasma arc inverter power source, comprising:
      (vi) an electrical enclosure positioned on top of said open frame of said second rack;
      (vii) means for providing the main interruptible electrical power of the first rack to a second common connection bus, and
      (viii) means for providing at least one isolated and interruptible electrical power supply from the common connection bus to at least one means for selectively providing electrical power to at least one said inverter power source, whereby the first rack detachably engages the second rack to provide means for selectively providing isolated and interruptible electrical power to at least two said inverter power sources.

2. The inverter power source rack of claim 1 wherein the first rack and second rack are made of aluminum.

3. The inverter power source rack of claim 1 wherein the disconnecting means of (ii) is a rotary disconnect switch.

4. The inverter power source rack of claim 1 wherein the means for providing interruptible electrical power in (iii) are fuses.

5. The inverter power source rack of claim 1 wherein the means for providing: isolated and interruptible electrical power sources in (iv) and (viii) are fuses.

6. The inverter power source rack of claim 1 wherein the means for selectively providing electrical power in (iv) and (viii) are selector switches.

7. The inverter power source rack of claim 1 wherein skids are mounted to the first and second racks.

8. The inverter power source rack of claim 1 wherein caster wheels are mounted to the first and second racks.

9. The inverter power source rack of claim 1 wherein the second rack is a slave rack adapted to receive electrical power from the first rack.

10. An inverter power source rack system comprising:
   (a) a lightweight moveable first rack consisting of an open frame having a centrally positioned spar therewithin, said open frame having two open levels shaped to support a first, second, third and fourth welding or plasma arc inverter power source, comprising:
      (i) an electrical enclosure positioned on top of said open frame of said first rack, said enclosure having a detachable cover positioned thereon;
      (ii) disconnecting means for receiving an external branch circuit electrical power supply,
      (iii) means for providing a main interruptible electrical power from the disconnecting means to a first common connection bus,
      (iv) means for providing a first, second, third and fourth isolated and interruptible electrical power supply from the first common connection bus to a first, second, third and fourth means for selectively providing electrical power to said first, second, third and fourth inverter power source, and
      (v) mechanical interlocking means to prevent removal of said cover while said disconnecting means are energized by said external branch circuit electrical power supply, said mechanical interlocking means comprising handle means positioned on said cover and detachably engaged with said disconnecting means, (b) a light weight moveable second rack consisting of an open frame having a centrally positioned spar therewithin, said open frame having two open levels shaped to support a fifth, sixth, seventh and eighth welding or plasma arc inverter power source, comprising:
   (vi) an electrical enclosure positioned on top of said open frame of said second rack;
   (vii) means for providing the main interruptible electrical power of the first rack to a second common connection bus, and
   (viii) means for providing a fifth, sixth, seventh and eighth isolated and interruptible electrical power supply from the second common connection bus to a fifth. sixth, seventh and eighth means for selectively providing electrical power to said fifth, sixth, seventh and eighth inverter power source whereby the first rack detachably engages the second rack to provide means for selectively providing isolated and interruptible electrical power to said first, second, third, fourth, fifth, sixth, seventh and eighth inverter power source.

11. The inverter power source rack of claim 10 wherein the first rack and second rack are made of aluminum.

12. The inverter power source rack of claim 10 wherein the means for selectively providing electrical power in (iv) and (viii) are selector switches.

13. The inverter power source rack of claim 10 wherein skids are mounted to the first and second racks.

14. The inverter power source rack of claim 10 wherein caster wheels are mounted to the first and second racks.

15. The inverter power source rack of claim 10 wherein the second rack is a slave rack.

16. The inverter power source rack of claim 10 wherein the first and the second rack are provided with lifting holes.

17. A collapsible inverter power source rack comprising:
   (a) a moveable first rack having an upper level and a lower level, said first rack comprising:
   two side frames, each of said side frame having an upper and a lower rung, an upper universal inverter support frame detachably connected to each of said upper run of said side frames to form said upper level of said first moveable rack and a lower universal inverter support frame detachably connected to each of said lower rungs of said side frames to form said lower level of said first moveable rack, a centrally disposed spar connected to said upper and said lower universal inverter support frames, said lower universal inverter support frame being adapted to support at least one welding or plasma arc inverter power source;
   (b) an electrical enclosure connected to said upper level of said first rack and having said spar passing therethrough, said electrical enclosure comprising:
      (i) a cover positioned on top of said electrical enclosure having said spar passing therethrough to expose an inverter lifting bracket connected to one end of said spar;
      (ii) disconnecting means for receiving an external branch circuit electrical power supply;
      (iii) means for providing a main interruptible electrical power from the disconnecting means to a first common connection bus,
      (iv) means for providing at least one isolated and interruptible electrical power supply from the first common connection bus to at least one means for selectively providing electrical power to at least one said inverter power source, and
      (v) mechanical interlocking means for preventing removal of said cover while said disconnecting means are energized by said external branch circuit electrical power supply, said mechanical interlocking means comprising handle means positioned on said cover and detachably and slidably engaged with said disconnecting means;
   (c) a moveable second rack having an upper level and a lower level, said second rack comprising:
   two side frames, each of said side frame having an upper and a lower rung, an upper universal inverter support frame detachably connected to each of said upper rungs of said side frames to form said upper level of said second rack and a lower universal inverter support frame detachably connected to each of said lower rungs of said side frames to form said lower level of said second rack, a centrally disposed spar connected to said upper and said lower universal inverter support frames, said lower universal inverter support frame being adapted to support at least one said welding or plasma arc inverter power source;
   (d) an electrical enclosure connected to said upper level of said second rack and having said spar passing therethrough, said electrical enclosure comprising:
      (v) a cover positioned on top of said electrical enclosure having said spar passing therethrough to expose an inverter lifting bracket connected to one end of said spar;
      (vi) means for providing the main interruptible electrical power of the first rack to a second common connection bus, and
      (vii) means for providing at least one isolated and interruptible electrical power supply from the second common connection bus to at least one means for selectively providing electrical power to at least one said inverter power source, whereby the first rack detachably engages the second rack to provide means for selectively providing isolated and interruptible electrical power to at least two said inverter power sources.

18. The collapsible inverter power source rack of claim 17 wherein said moveable second rack is a slave rack.

19. The collapsible inverter power source rack of claim 17 wherein said moveable first rack and said moveable second rack are in a disassembled state during shipping and transportation.

20. The collapsible inverter power source rack of claim 17 wherein said moveable first rack further comprises each of said side frames having a mid-level rung, each of said mid-level rungs being detachably connected to a mid-level universal inverter support frame to form a mid level of said first rack, said mid-level universal inverter support frame being adapted to support at least one said welding or plasma arc inverter power source.

21. The collapsible inverter power source rack of claim 17 wherein said moveable second rack further comprises each of said side frames having a mid-level rung, each of said mid-level rungs being detachably connected to a mid-level universal inverter support frame to form a mid level of said second rack, said mid-level universal inverter support frame being adapted to support at least one said welding or plasma arc inverter power source.

22. The collapsible inverter power source rack of claim 17 wherein said moveable first rack further comprises each of said side frames having a mid-level rung, each of said mid-level rungs being detachably connected to a mid-level universal inverter support frame to form a mid level of said first rack, said mid-level universal inverter support frame being adapted to support at least one said welding or plasma arc inverter power source; and wherein said moveable second rack further comprises each of said side frames having a mid-level rung, each of said mid-level rungs being detachably connected to a mid-level universal inverter support frame to form a mid level of said second rack, said mid-level universal inverter support frame being adapted to support at least one said welding or plasma arc inverter power source.

23. The collapsible inverter power source rack of claim 17 wherein skids are mounted to the first and second racks.

24. The collapsible inverter power source rack of claim 17 wherein caster wheels are mounted to the first and second racks.

25. A collapsible inverter power source rack comprising:
   a moveable first and a movable second rack, each of said racks having an upper level and a lower level comprising:
   two side frames, each of said side frames having an upper and a lower rung, an "H" shaped upper universal inverter support frame detachably connected to each of said upper rungs of said side frames to form said upper level and an "H" shaped lower universal inverter support frame detachably connected to each of said lower rungs of said side frames to form said lower level, a centrally disposed spar connected to said upper and said lower universal inverter support frames, said lower universal inverter support frame being adapted to support at least one welding or plasma arc inverter power source, an electrical enclosure connected to said upper level of each of said racks and having said spar passing therethrough;

where said electrical enclosure of said first rack comprises:
   (i) a cover positioned on top of said electrical enclosure of said first rack having said spar passing therethrough to expose an inverter lifting bracket connected to an exposed end of said spar,
   (ii) disconnecting means having a rotary switch therein for receiving an external branch circuit electrical power supply,
   (iii) means for providing a main interruptible electrical power from the disconnecting means to a first common connection bus,
   (iv) means for providing at least one isolated and interruptible electrical power supply from the first common connection bus to at least one means for selectively providing electrical power to at least one said inverter power source, and
   (v) mechanical interlocking means for preventing removal of said cover while said disconnecting means are energized by said external branch circuit electrical power supply, said mechanical interlocking means comprising handle means positioned on said cover and detachably and slidably engaged with said rotary switch;
   and where said electrical enclosure of said second rack having said spar passing therethrough comprises:
   (v) a cover positioned on top of said electrical enclosure of said second rack having said spar passing therethrough to expose an inverter lifting bracket connected to an exposed end of said spar;
   (vi) means for providing the main interruptible electrical power of the first rack to a second common connection bus, and
   (vii) means for providing at least one isolated and interruptible electrical power supply from the second common connection bus to at least one means for selectively providing electrical power to at least one said inverter power source, whereby the first rack detachably engages the second rack to provide means for selectively providing isolated and interruptible electrical power to at least two said inverter power sources.

* * * * *